United States Patent
Knotz (10) Patent No.: US 7,660,336 B2
(45) Date of Patent: Feb. 9, 2010

(54) METHOD AND DEVICE FOR DETERMINING AN ACTIVATION THRESHOLD

(75) Inventor: Herbert Knotz, Erbach (DE)

(73) Assignee: ATMEL Automotive GmbH, Heilbronn (DE)

( * ) Notice: Subject to any disclaimer, the term of this patent is extended or adjusted under 35 U.S.C. 154(b) by 85 days.

(21) Appl. No.: 11/355,971

(22) Filed: Feb. 17, 2006

(65) Prior Publication Data

US 2006/0187982 A1    Aug. 24, 2006

(30) Foreign Application Priority Data

Feb. 18, 2005    (DE) .................... 10 2005 009 317

(51) Int. Cl.
*H01S 3/00*    (2006.01)
(52) U.S. Cl. ............... 372/38.01; 372/38.1; 372/38.02; 372/38.07
(58) Field of Classification Search ............... 372/38.1, 372/38.01–38.09
See application file for complete search history.

(56) References Cited

U.S. PATENT DOCUMENTS

| | | | |
|---|---|---|---|
| 5,260,955 A | | 11/1993 | Davis et al. |
| 5,323,408 A | | 6/1994 | Hahn et al. |
| 5,579,329 A | * | 11/1996 | Taguchi ................... 372/38.01 |
| 5,966,395 A | * | 10/1999 | Ikeda ....................... 372/38.01 |
| 2004/0042514 A1 | * | 3/2004 | Nishimura et al. ....... 372/38.02 |
| 2004/0052281 A1 | | 3/2004 | Hamajima et al. |

FOREIGN PATENT DOCUMENTS

| | | |
|---|---|---|
| DE | 31 13 039 A1 | 10/1982 |
| EP | 0 141 191 A2 | 5/1985 |
| WO | WO 2004/105004 A1 | 12/2004 |

* cited by examiner

*Primary Examiner*—Minsun Harvey
*Assistant Examiner*—Xnning Niu
(74) *Attorney, Agent, or Firm*—Muncy, Geissler, Olds & Lowe, PLLC (57) ABSTRACT

A method is provided for determining a laser threshold of a laser diode, which is operated by a drive circuit as a function of a first signal in a first feedback and a second signal in a second feedback, the first feedback being supplied via an optical coupling of an optical output signal of the laser diode. The method is characterized in that the second feedback is supplied by an electrical signal picked up between the drive circuit and the laser diode, the electrical signal is compared with an adjustable activation threshold, only a portion of the electrical signal that exceeds the adjustable activation threshold is transmitted to the drive circuit in such a way that the second feedback is active only when such a portion occurs, the adjustable activation threshold is changed in such a way that the activity state of the second feedback changes, and the laser threshold of the laser diode is determined as a function of the value of the adjustable activation threshold during a change in the activity state of the second feedback. Furthermore, a drive circuit is presented which carries out the method.

10 Claims, 3 Drawing Sheets

METHOD AND DEVICE FOR DETERMINING AN ACTIVATION THRESHOLD

This nonprovisional application claims priority under 35 U.S.C. § 119(a) on German Patent Application No. DE 102005009317, which was filed in Germany on Feb. 18, 2005, and which is herein incorporated by reference.

BACKGROUND OF THE INVENTION

1. Field of the Invention

The present invention relates to a method for determining a laser threshold of a laser diode, which is operated by a drive circuit as a function of a first signal in a first feedback and a second signal in a second feedback, the first feedback being supplied via an optical coupling by an optical output signal of the laser diode.

The invention relates furthermore to a drive circuit, which determines the laser threshold of a laser diode, wherein the drive circuit generates a drive signal and the laser diode an output signal, dependent on the drive signal, with a first feedback and a second feedback, the first feedback being set up to supply a portion of the output signal via an optical coupling.

2. Description of the Background Art

A method and drive circuit are known from U.S. Pat. No. 5,260,955. According to this publication, the optical power/drive current characteristic of a laser diode has a lower, nonlinear section of lower drive currents and optical powers. Furthermore, the characteristic has an upper section of higher drive currents and optical powers, in which the optical power depends approximately linearly on the drive current. The linear section in the patent is called a lasing region and the nonlinear region is called a light emitting or spontaneous emission region. Both sections are separated by a value of the drive current, which is also called the laser threshold. Knowing the laser threshold is helpful for controlling the laser diode.

To determine the laser threshold two feedbacks are provided in U.S. Pat. No. 5,260,955, which are connected by a common electrical connection node to a photodiode. A first feedback serves to regulate the power of the laser diode during laser diode operation. The second feedback serves to determine the laser threshold. To that end, the signal in the second feedback is compared with a fixed threshold value. As long as the threshold value is not exceeded, an increase in the laser diode drive current occurs successively. If the threshold value, which correlates with a specific optical power received by the photodiode, is exceeded, the associated drive current is maintained with no further changes. During operation, the second feedback then supplies this laser threshold/drive current, whereas a reference signal generator supplies control signals for the drive current contributions above the laser threshold. These are stabilized with the first feedback.

In prior-art arrangements of drive circuits and laser diodes, the stabilization occurs in the following manner: The first feedback is connected to a feedback signal input of a differential amplifier and receives part of the emitted laser diode optical power via the photodiode. A reference signal, which controls the optical power of the laser diode, is supplied furthermore to the differential amplifier. If the laser diode emits a relatively high optical power, the photodiode supplies a high photocurrent to the feedback signal input of the differential amplifier, which makes the output signal of the differential amplifier smaller and thereby reduces the laser diode optical power. Accordingly, a relatively low emitted optical power leads to an increase in the difference and thereby to an increase in the optical power. The feedback thereby closes a control loop by which a stable optical power becomes established in the built-up state.

The laser thresholds for driving individual laser diodes can also be individually different in laser diodes of the same type and in addition change due to aging influences. In a laser diode type serving as an example here, the individual laser threshold of an individual laser diode can be, for example, within a range of drive current intensities between 10 mA and 50 mA. To be able to generate defined output signals with defined drive signals, it is therefore helpful to know the individual laser threshold of a laser diode. This applies very generally also to other components that have an activation threshold, or to arrangements comprising a differential amplifier and a laser diode. In this type of arrangement, the drive current intensity, at which a laser effect begins in the laser diode, depends in addition on the offset current of the amplifier. If an output signal of a laser diode is indicated below, this usually refers to an optical power above the laser threshold or activation threshold.

For the greatest possible control for the optical power of the laser diode and thereby the output signals of the laser diode, it is desirable to know the tolerance pertaining to the laser threshold.

In addition, drive current sources, for example, have various examples of the aforementioned differential amplifier, frequently also dispersion in their input/output signal relation, which are to be compensated for a defined function of the component by adjustment of the differential amplifier. This adjustment can occur the more accurately, the better the operating condition of the differential amplifier during adjustment coincides with the operating conditions during later operation. Because drive current intensities of the magnitude of the laser threshold are to be provided during later operation, the adjustment should occur as closely as possible to the laser threshold. For this reason as well, it is desirable to know the laser threshold.

In the method disclosed in U.S. Pat. No. 5,260,955, to determine the laser threshold, the drive signal passes through a certain signal bandwidth and in so doing, an activity in the signal path behind the optical coupling between the laser diode and photodiode is determined by a threshold value comparison. In practice, this type of feedback having an optical coupling reacts especially very sensitively to measuring actions in laser diodes. A sufficient reliability and accuracy of the obtained results are therefore not readily assured.

SUMMARY OF THE INVENTION

It is therefore an object of the present invention to provide a method and a drive circuit, with which individual activation thresholds of individual components, particularly individual laser thresholds of individual laser diodes, can be accurately reproduced and reliably determined.

This object is achieved, in an embodiment, in such a way that the second feedback is supplied by an electrical signal picked up between the drive circuit and the laser diode, the electrical signal is compared with an adjustable activation threshold (SW2), only a portion of the electrical signal that exceeds the adjustable activation threshold (SW2) is transmitted to the drive circuit in such a way that the second feedback is active only when such a portion occurs, the adjustable activation threshold (SW2) is changed in such a way that the activity state of the second feedback changes, and the laser threshold (SW1) of the laser diode (12) is determined as a function of the value of the adjustable activation threshold (SW2) during a change in the activity state of the second feedback.

Furthermore, this object is achieved in a drive circuit, whereby the second feedback is set up to supply an electrical signal by an electrical connection to a junction, conducting the drive signal, between the drive circuit and the laser diode, and furthermore is set up to compare the electrical signal with an adjustable activation threshold, to transmit only a portion of the electrical signal, which exceeds the adjustable activation threshold, to the drive circuit in such a way that the second feedback is active only when such a portion occurs, to change the adjustable activation threshold in such a way that the activity state of the second feedback changes, and to determine the laser threshold of the laser diode as a function of the value of the adjustable activation threshold during a change in the activity state of the second feedback.

In this regard, a change in the activity state preferably means a transition between an active and inactive second feedback. These features permit a determination of the laser threshold or a first activation threshold without interventions in this sensitive signal path behind the optical coupling between laser diode and photodiode. Instead, an indirect determination of the laser threshold occurs in the second feedback, which competes with the first feedback to influence the feedback signal and responds more robustly to measuring actions. The competition of feedbacks is always won by the feedback with the smaller threshold (laser threshold or second activation threshold). If the second activation threshold, for example, is greater than the laser threshold, the laser diode emits an output signal, which is stabilized by the first feedback. The second feedback is then not active; this corresponds to a first activity state.

With a reduction of the second activation threshold to values below the laser threshold, the arrangement in contrast builds up to the now smaller second activation threshold. The component then no longer supplies an output signal. As a result, the first feedback is not active, whereas the second feedback conducts a signal and is therefore active. By variation of the adjustable activation threshold, the activity state of the second feedback therefore changes precisely at the value of the laser threshold. Therefore, the invention permits an indirect, reproducibly accurate, and reliable determination of the laser threshold by a measuring action in the second feedback, which is electrically independent of the optical coupling.

Optical couplings usually generate only small electrical signals and therefore respond very sensitively to measuring actions. The indirect measurement in this application therefore represents a possibility for reliable and reproducibly accurate determination of the laser threshold.

The second feedback can have a threshold value filter, which allows only signals to pass that exceed the adjustable threshold value.

This embodiment represents a simple circuit realization of an adjustable activation threshold.

In another embodiment, the drive circuit can have a controllable current source as a threshold value filter, which receives or emits a current up to a current intensity corresponding to the adjustable threshold value.

This embodiment represents an especially simple and continuous form of threshold value filtering. The current source can be realized, e.g., as a source of negative currents, therefore as a current sink, which is connected to the second feedback and receives low currents and allows only the current exceeding its maximum current to pass into the feedback.

The drive circuit can also have a differential amplifier with an output, which provides the drive signal, a reference signal input, which is supplied by a reference signal generator, and a feedback signal input, which is coupled both to the first feedback and to the second feedback.

This embodiment represents a simple circuit realization by which a competition between the two feedbacks is created.

Furthermore the second feedback can have a decoupling circuit, which decouples a feedback signal from the second feedback and supplies it to the subcircuit.

By means of a decoupling occurring parallel to the transmission of the feedback signal to the second feedback, the determination of the first activation threshold can occur continuously in the adjustment mode and without interfering effects of the loop from the differential amplifier and second feedback.

The decoupling circuit can have a current mirror, which reflects a current supplied from the differential amplifier to the second feedback both in a branch circuit leading to the feedback signal input and also in a measuring branch of the subcircuit.

The decoupling with the current mirror has the advantage that the number and dimensioning of the employed components can set any transformation ratios between the currents in the different branches of the current mirror. For this reason, for example, both the attenuation of the signal feedback and also a current sufficiently large as needed can be set in the measuring branch.

The subcircuit can have a detector, which determines a signal strength of the decoupled feedback signal and transmits this to a controller.

This embodiment represents a simple circuit realization of an indirect determination of the first activation threshold.

A further embodiment provides that the detector periodically samples the signal strength.

A sequence of discrete measured values with minimal interaction with the current in the measuring branch is produced by the periodic sampling.

The detector can be constructed as a clocked comparator, because it has a very high sensitivity. This permits minimization of the interaction of the measuring action with the second feedback.

A further embodiment includes a compensation signal source, whereby, the subcircuit after storing the measurement for a first activation threshold with use of this measurement forms and stores a compensation signal, which compensates the first activation threshold up to a defined residual offset, and the subcircuit can feed the stored compensation signal, in addition to a reference signal supplied by the reference signal generator, to the reference input or to the feedback signal input. The aforementioned residual offset can be produced, for example, by a third threshold value, which is active during the verification of the activity of the second feedback. This verification will be explained in greater detail below.

By means of this embodiment the compensation signal to a certain extent assumes the provision of a drive signal portion, which corresponds to the first activation threshold. The first activation threshold to a certain extent represents the laser threshold of the laser diode in the arrangement with an offset-encumbered amplifier. The reference signal generator must then only provide the drive signal portion, by which changes in the output signal of the component are controlled. An improved controllability of changes in the output signal is thus the result.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
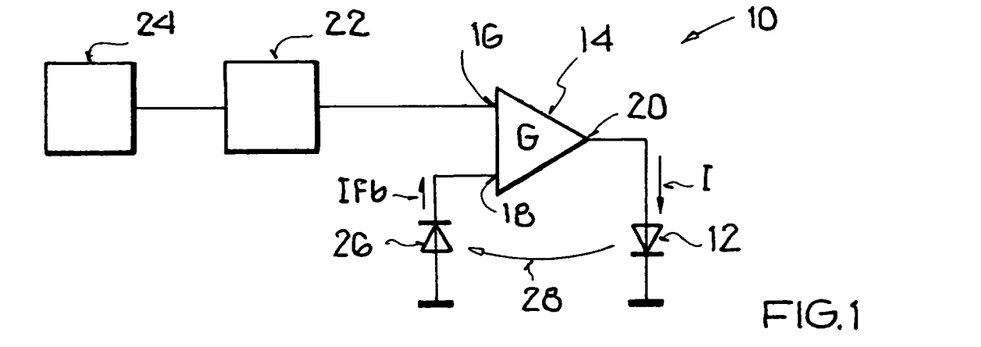
FIG. 1 illustrates a drive circuit with a first feedback.

FIG. 1 shows a drive circuit 10, which drives a laser diode 12. Drive circuit 10 has a differential amplifier 14, which has a reference signal input 16, a feedback signal input 18, and an output 20, and a reference signal generator 22, a controller 24, and a photodiode 26. Reference signal input 16 is supplied by reference signal generator 22, which is controlled by controller 24. Photodiode 26 is connected to feedback signal input 18, and during operation of drive circuit 10 and laser diode 12, it receives part of the optical power emitted by laser diode 12 through an optical coupling 28 and converts it into a photocurrent. The photocurrent functions as feedback signal Ifb. Differential amplifier 14 provides a current I as a drive signal for laser diode 12, which depends on the amplification factor G of differential amplifier 14 and the difference of the signal at reference signal input 16 and feedback signal input 18. In this way, the power emitted by laser diode 12 and the signal form of the optical output signal are determined by reference signal generator 22 and controller 24 and controlled in a first feedback, which is closed via optical coupling 28 between laser diode 12 and photodiode 26.

Figure 2A:
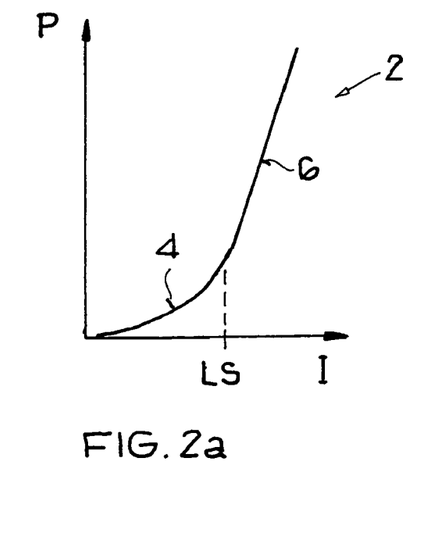
FIG. 2 is a real and idealized characteristic of a laser diode.

FIG. 2a shows a real characteristic 2 of laser diode 12. Here, an optical power P of laser diode 12 is plotted versus the driving input signal I. Characteristic 2 has a lower, nonlinear section 4 of lower drive currents and optical powers. Furthermore, characteristic 2 has an upper section 6 of higher drive currents and optical powers, in which the optical power P depends approximately linearly on the drive current I. The linear section 6 is the lasing region and the nonlinear region 4 the light emitting or spontaneous emission region. Both sections 4, 6 are separated by a value of the drive current I, which is also called the laser threshold LS. Knowing the laser threshold LS is helpful for controlling the laser diode 12.

Figure 2B:
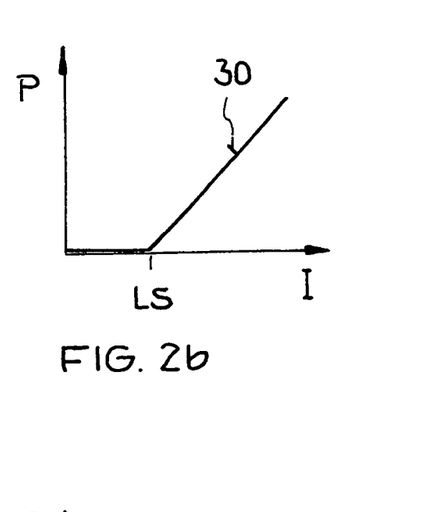

FIG. 2b shows an idealized characteristic 30 of laser diode 12. An optical power P of laser diode 12 is again plotted versus the driving input signal I. In the idealized characteristic 30, section 4 of the characteristic 2 of FIG. 2a, therefore the range of the spontaneous emission, is represented as a straight line parallel to the I axis with the value zero. In this idealized but not unusual representation, an optical power P occurs only when the drive signal I exceeds a laser threshold LS. This curve corresponds to the aforementioned and totally typical convention, according to which only optical powers from the characteristic section above the laser threshold are regarded as output signals. Reference will be made further herein below to the subject of FIG. 3.

Figure 4A:
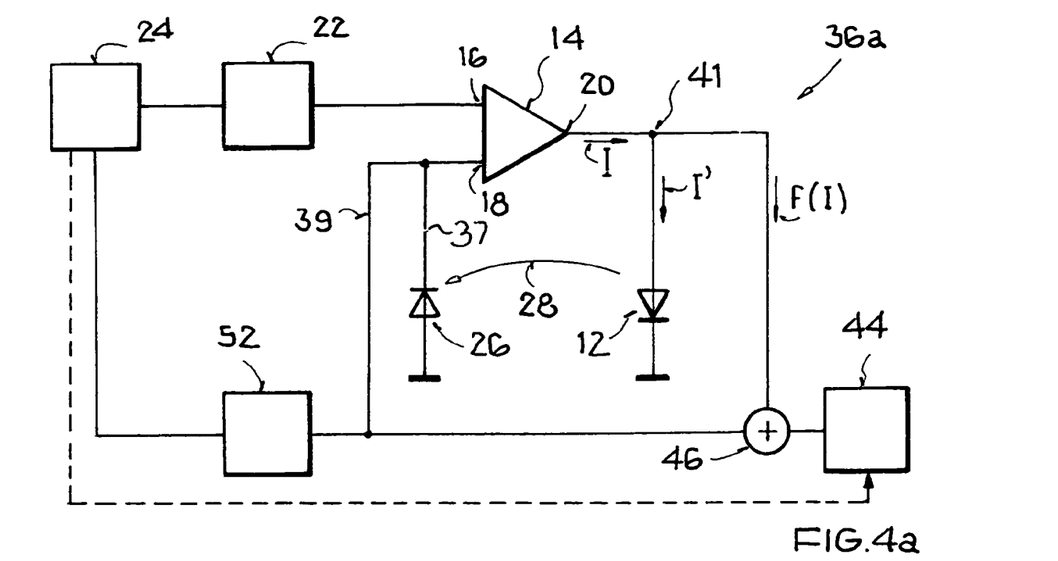
FIG. 4a-b are block diagrams according to embodiments of a drive circuit of the invention.
Figure 4B:
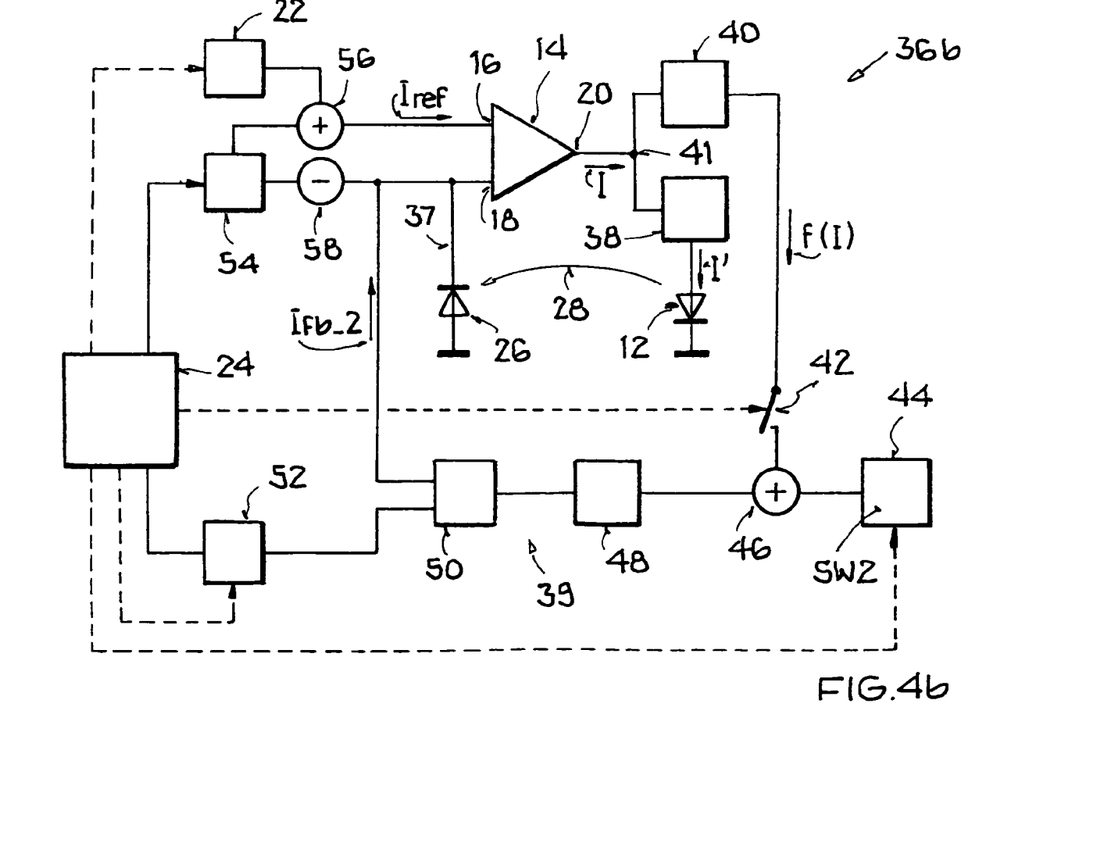

FIGS. 4a-b show block diagrams of embodiments of a drive circuit, by which the laser threshold LS can be determined. Aspects of the device and method are represented thereby by the block diagrams. Specifically, FIG. 4a shows a drive circuit 36a, which determines the laser threshold LS of laser diode 12. The drive circuit 36a is based on the drive circuit 10 of FIG. 1 and therefore has, inter alia, laser diode 12, differential amplifier 14 with reference signal input 16, feedback signal input 18, and output 20, a reference signal generator 22, a controller 24, and a photodiode 26, which is connected to feedback signal input 18 of differential amplifier 14. In other respects, the same reference characters in the figures describe the same items. Drive circuit 36a generates a drive signal I, I', and laser diode 12 generates an output signal dependent on drive signal I, I', which acts on photodiode 26 via optical coupling 28. Drive circuit 36a furthermore has a first feedback 37 and a second feedback 39, whereby first feedback 37 is set up to supply a portion of the output signal of laser diode 12 via optical coupling 28.

Second feedback 39, in contrast, is set up by an electrical connection 41 at a junction conducting drive signal I, I' between drive circuit 36a and laser diode 12 to supply an electrical signal. In the embodiment of FIG. 4a, the connection 41 is located between output 20 of differential amplifier 14 and laser diode 12. The second feedback 39 is furthermore set up to compare the electrical signal with an adjustable activation threshold SW2, to transmit only a portion of the electrical signal that exceeds the adjustable activation threshold SW2 to the drive circuit, so that the second feedback is active only when such a portion occurs, to change the adjustable activation threshold SW2 in such a way that the activity state of the second feedback changes, and to determine the laser threshold LS of laser diode 12 as a function of the value of the adjustable activation threshold SW2 during a change in the activity state of second feedback 39. The adjustable activation threshold SW2 is provided by a threshold value filter 44 and is linked in a threshold value linkage 46 with the electrical signal of connection 41. In this regard, the adjustable activation threshold SW2 in a determination mode, for example, is initially smaller than the laser threshold LS, which is active in the first feedback. However, a second activation threshold SW2, which is greater than the laser threshold, can also be used first. The second activation threshold is then made successively smaller until a change in the activity of the second feedback occurs.

The signal f(I) coupled into second feedback 39 is linked in the threshold value linkage 46 with the initially comparatively low adjustable activation threshold SW2 of threshold value filter 44. In so doing, the linkage can occur, for example, so that threshold value filter 44 can draw a current up to a preset maximum value from the threshold value linkage 46, so that the threshold value linkage 46 transmits a signal portion only when the maximum value, preset by threshold value filter 44, is exceeded by the signal f(I).

To determine the laser threshold LS, thereby, the electrical signal f(I) is compared with an adjustable activation threshold SW2 and only the portion of the electrical signal f(I) that exceeds the adjustable activation threshold SW2 is transmitted to the rest of drive circuit 36a. The second feedback 39 is therefore active only when such a portion occurs. Furthermore, the adjustable activation threshold SW2 is changed by controller 24 in such a way that the activity state of second feedback 39 changes. This is represented in FIG. 4a by the dashed line between controller 24 and threshold value filter 44. The activity of second feedback 39 is monitored by block

52, which checks, for example, for the presence of a feedback signal with a predefined minimum signal strength. The laser threshold LS of laser diode 12 is then determined as a function of the value of the adjustable activation threshold SW2 during a change in the activity state of the second feedback. In this regard, the activity state changes precisely when the value of the second activation threshold SW2 passes through the value of the laser threshold LS.

The drive circuit 36b of FIG. 4b is also based on the drive circuit 10 of FIG. 1 and therefore has, inter alia, laser diode 12, differential amplifier 14 with reference signal input 16, feedback signal input 18, and output 20, reference signal generator 22, controller 24, and photodiode 26, which is connected to feedback signal input 18 of differential amplifier 14. Optical coupling 28 closes the first feedback 37.

In addition to these components, drive circuit 36b has an output stage 38, a second feedback 39 with a connection 41 between differential amplifier output 20 and laser diode 12, a decoupler 40, as an option a switch 42, threshold value filter 44, threshold value linkage 46, an attenuator 48, and a decoupling circuit 50. Furthermore, drive circuit 36b has a detector 52, and as an option a compensation current source 54 with a linkage 56 and/or a linkage 58. In this regard, output stage 38 is used only to amplify further the output signal I of differential amplifier 14 to a drive signal I' of laser diode 12. The decoupling 40 is used to decouple a signal f(I), which is conducted in the determination mode via second feedback 39 proportionally to feedback signal input 18 of differential amplifier 14.

In this regard, the threshold value filter 44 predetermines an adjustable activation threshold SW2 for control via the second feedback, whereby the adjustable activation threshold SW2 in a determination mode here as well is initially smaller or initially greater than the laser threshold LS, which is active in the first feedback. Signal I or f(I) of the differential amplifier 14, which is coupled into second feedback 39 via decoupler 40, is linked in threshold value linkage 46 with the initially comparatively low adjustable activation threshold SW2 of threshold value filter 44. In so doing, the linkage can occur here as well so that threshold value filter 44 can draw a current up to a preset maximum value from the threshold value linkage 46, so that the threshold value linkage 46 transmits a signal to attenuator 48 only when the maximum value preset by threshold value filter 44 is exceeded by the signal f(I).

The portion of the signal f(I) exceeding the second threshold value SW2, and/or the portion of output signal I of differential amplifier 14 are attenuated by attenuator 48 to an extent that a stable second feedback is assured. The attenuated signal is applied as feedback signal Ifb_2 of the second feedback via decoupling circuit 50 to feedback signal input 18 of the differential amplifier 14. The optional components 42, 54, 56, 58 realize embodiments, which can also be realized in conjunction with drive circuit 36a and will be described in greater detail below. To produce a drive signal at a negative offset of amplifier 14 as well, amplifier 14 is modulated accordingly. It is therefore modulated in such a way that a positive drive current occurs also at a maximum possible negative offset.

It is applicable in the case of the embodiments of FIG. 4a and 4b that the drive signal can be back coupled in principle either via the first feedback 37 or via the second feedback 39 in attenuated form in each case to feedback signal input 18. The two feedbacks therefore compete with one another. In this case, the feedback in which the smaller activation threshold is active always wins: In qualitative terms, the feedback with the smaller activation threshold subtracts a smaller part of the drive signal and thereby supplies a larger feedback signal to feedback signal input 18. Accordingly, a smaller input signal difference results for the larger feedback signal at differential amplifier 14 and thereby also a smaller drive signal. The smaller drive signal is then no longer sufficient to overcome the higher threshold (activation threshold SW2 or laser threshold LS), so that the feedback in which the higher threshold is active is deactivated.

If, for example, a determination mode is begun in which the second activation threshold SW2 acting in second feedback 39 is initially lower than the laser threshold LS acting in first feedback 37, the second feedback 39 is active and laser diode 12 generates no output signal within the meaning of the aforementioned convention. As a result, there is also no relevant optical coupling 28 between laser diode 12 and photodiode 26, so that the first feedback 37, which is closed via this optical coupling 28 during normal operation, is substantially deactivated.

With a gradual increase in the adjustable threshold value SW2, an increasing signal portion is subtracted in threshold value linkage 46 of second feedback 39, so that the feedback signal active at feedback signal input 18 declines. Accordingly, the input signal difference of differential amplifier 14 and thereby also the drive signal I becomes greater. If the adjustable activation threshold SW2 becomes greater than the first activation threshold SW1, the laser diode 12 generates an output signal, which activates first feedback 37 and deactivates second feedback 39. The transition between the activity states "active" and "inactive" of second feedback 39 thereby passes through the first activation threshold SW1. In other words: The laser threshold LS, or more generally, an activation threshold SW1, which must be exceeded by drive currents to trigger an emission of optical power laser diode 12 relevant as an output signal, is indirectly determined as the value of the threshold value SW2 of second feedback 39, in which second feedback 39 is deactivated.

The metrological differentiation of an active second feedback 39 from an inactive second feedback 39 by measurements made at a second feedback 39, exhibiting no optical coupling, therefore permits an indirect determination of the laser threshold LS. For this purpose, the decoupling circuit 50 decouples a signal from the second feedback 39, in which the signal f(I) is reflected as feedback signal Ifb_2. The reflection can be identical, for example, so that a signal Ifb_2 is fed both to detector 52 and is also supplied to the feedback signal input 18.

The detector 52 compares the fed feedback signal Ifb_2 with a predefined third threshold value SW3 and supplies an appropriate signal to controller 24 when the value exceeds or falls below the third threshold value SW3. Controller 24 controls the detector 52 via the dashed connection between blocks 24 and 52, for example, so that detector 52 samples its input signal in a clock pulse predefined by controller 24 and compares it with the third threshold value SW3. Detector 52 and controller 24 therefore form a subcircuit, which monitors an activity state of the second feedback 39. The second feedback 39 is active as long as detector 52 records an exceeding of the threshold value SW3. A value below the threshold, on the contrary, indicates an inactive second feedback 39. The value of the adjustable activation threshold SW2, in which such a change between two activity states of the second feedback 39 occurs, then corresponds to the value of the laser threshold LS.

The method aspect of the invention can therefore be realized by means of the following steps: Feeding a signal f(I) dependent on the drive signal I, I' to a second feedback 39, competing with the first feedback 37 to influence the feedback signal, whereby in the second feedback 39 an adjustable activation threshold SW2 is active, determination of an activity state of the second feedback 39, changing of the adjustable activation threshold SW2 so that the activity state of the second feedback 39 changes, and determination of the laser threshold LS as a value of the adjustable activation threshold SW2 during a change in the activity state of second feedback 39.

Figure 5:
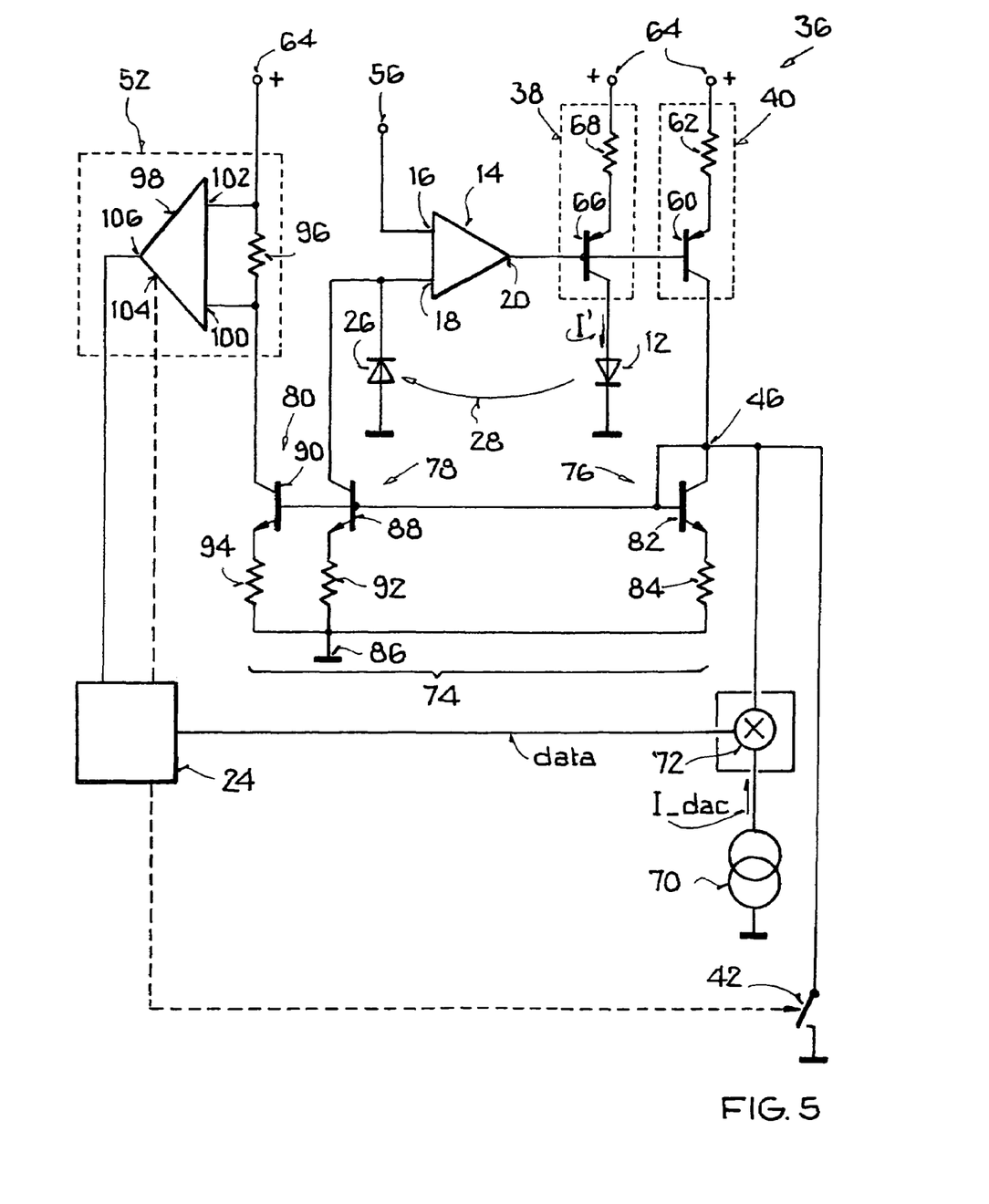
FIG. 5 is a circuit of an embodiment of a drive circuit of the invention.

FIG. 5 shows a circuit diagram as an example of possible circuit realizations of various blocks from FIG. 4. Thus, the decoupling 40 can occur by a transistor 60, which is connected via an emitter resistor 62 to a supply potential 64, which is controlled by the output signal of the differential amplifier 14, and whose collector is connected to threshold value linkage 46. In the drive circuit 36 according to FIG. 5, the output signal of the differential amplifier can be a voltage or current. The output stage 38 can also be realized by a transistor 66, which is connected via an emitter resistor 68 to supply potential 64, which is likewise controlled by output signal I of differential amplifier 14, and whose collector current functions as drive signal I' of laser diode 12. The threshold value filter 44 can be realized as a digital-to-analog converter, which weighs a reference current I_dac of a current source 70 in accordance with the data word issued by controller 24, which is represented by linkage 72. The weighting occurs in such a way that the threshold value filter 44 subtracts a current of variable intensity but of predefined maximum intensity from the threshold value linkage 46.

A current mirror 74, which has three branches 76, 78, and 80, reflects a current, flowing in the first branch 76 from the threshold value linkage 46 across a transistor 82 and a resistor 84 to a ground potential 86, as a feedback current Ifb_2 in the other two branches 78 and 80, which also have one transistor 88, 90 and emitter resistor 92, 94 each. The collector of transistor 88 of second branch 78 is connected to feedback signal input 18 of differential amplifier 14 and thereby closes second feedback 39.

The attenuation shown as block 48 in FIG. 4 results in the embodiment according to FIG. 5 due to the transformation ratio of the currents in branches 76 and 78. The current reflected in the third branch 80 represents a current decoupled from the second feedback, so that the third branch 80 in conjunction with the two other branches 76, 78 of the current reflector 74 represents the function of decoupling circuit 50 of FIG. 4. In this case, transistors 82, 88, 90 and resistors 84, 92, 94 can be dimensioned so that a different current is fed into third branch 80 acting as the measuring branch than into second branch 78 acting as the feedback branch. The voltage drop across a measuring resistor 96, for example, can be increased by a higher current in measuring branch 80, which increases the sensitivity of the measurement. Detector 52 from FIG. 4 is realized, e.g., by a comparator 98 in conjunction with measuring resistor 96. Comparator 98 can be constructed as a "latched comparator" or "clocked comparator." This type of clocked comparator has, in addition to differential inputs 100 and 102, a clock input 104, which is connected to controller 24. With a switched on clock signal, a positive feedback within comparator 98 is activated, which maintains the state at output 106 of comparator 98. This is then independent of the input signal, i.e., until the next clock signal pulse. The amplification of comparator 98 at the switching time becomes very large due to the positive feedback, so that even the smallest changes between differential inputs 100 and 102 lead to clear signals at output 106. The third threshold value SW3 can be realized thereby in different ways during circuit design. Examples are a suitably dimensioned offset of comparator 98 or an additional current sink, which removes a current, corresponding to the third threshold value SW3, at the collector of transistor 80.

Again with reference to FIG. 4b, an explanation will be provided below of how the thus determined first activation threshold is compensated within the scope of an embodiment during operation of the drive circuit.

As previously described, a laser threshold LS of laser diode 12 was determined as the minimal value for the drive current intensity, at which laser diode 12 emits an output signal within the meaning of the aforementioned convention. The drive current intensity is ultimately produced by differential amplifier 14, which itself can have tolerances in its input/output signal relation.

To understand additional embodiments, it is pointed out that characteristics of a differential amplifier have a similar form as the characteristics of laser diodes, whereby offset current influences in an arrangement comprising component 12 and differential amplifier 14 can shift characteristic 30 of laser diode 12 both to the left and to the right. During operation of an arrangement comprising a laser diode 12 with a differential amplifier 14, therefore, an activation threshold f(SW1) for the output signal of the laser diode arises, which depends on the tolerances of the laser diode and on offset influences of the differential amplifier.

Figure 3:
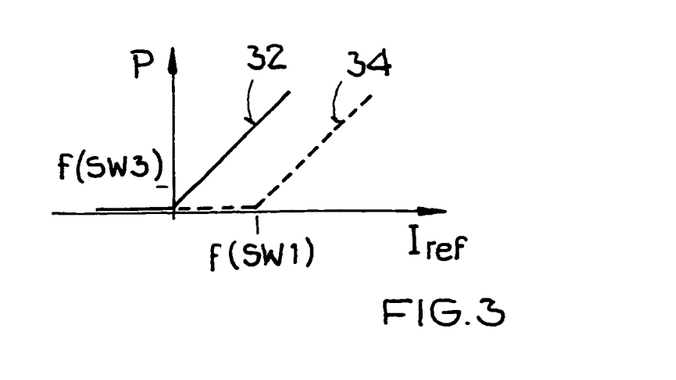
FIG. 3 shows characteristics of an arrangement comprising a laser diode and a differential amplifier.

FIG. 3 shows typical (idealized) characteristics, as result for this type of dependences. In this case, the output signal P of laser diode 12 is plotted versus the reference signal Iref, whereby the characteristics with an opened loop, therefore with a constant signal at feedback signal input 18, have been taken up. In contrast to FIG. 2, in which the power P is plotted versus drive current I, therefore versus a value at the output of the differential amplifier, the power P in FIG. 3 is therefore plotted versus a value Iref at the input of the differential amplifier. In this plot, the laser threshold LS, or more generally, the first activation threshold SW1 is represented at a value f(SW1), with which the differential amplifier is to be modulated at the input side, in order to provide at the output side a drive current corresponding to the first activation threshold SW1.

Specifically, FIG. 3 shows two (idealized) characteristics 32 and 34, where the number 32 designates an optimal characteristic. The optimal characteristic 32 is characterized in that even a small change, different from zero, in the reference signal Iref results in a change, different from zero, in the output signal P.

Because of tolerances of differential amplifiers and laser diodes, however, shifted characteristics usually occur. The characteristic 34 shown as a dashed line arises from the optimal characteristic 32 by a shift to the right, which corresponds to a resulting negative total offset: If the optimal characteristic 32 is regarded as a function of Iref, then the characteristic 34 is to be formed as the same function with the argument (Iref−Ioff), whereby Ioff corresponds to the resulting total offset.

The already mentioned compensation current source 54 with the linkage 56 and/or the linkage 58 is used to compensate this total offset. After the first activation threshold SW1=SW2 is determined, the threshold value filter 44 is set to a slightly lower value, in order to deactivate the first feedback for the compensation. As a result, an operating condition is produced for differential amplifier 14 in the comparison mode; this condition corresponds largely to the operating conditions, which are determined by the activation threshold SW1 and which result during normal operation with control of the laser diode output power. As the desired result, errors, which could become established during a final loop amplification, are minimized during the adjustment. Without knowledge of the activation threshold SW1, the second threshold value SW2 active during the adjustment would have to be set to a much lower value, to assure that laser diodes as well with a laser threshold occurring at the lower boundary of the tolerance interval (in the aforesaid example: at the lower boundary of the interval (10 mA, 50 mA)) are not yet activated. The indicated equating of SW1 and SW2 during the change in the activity of the second feedback applies to the special case that the currents in the current sources 38 and 40 are the same. Preferably, these current sources 38, 40 are dimensioned, however, in such a way that the current of current source 40 is lower than the current of current source 38. If, for example, the current in current source 38 corresponds, for example, to the x-fold value of the current of current source 40, the activity of the second feedback changes accordingly at a value SW2 that satisfies the equation SW1=x*SW2. Consequently, this correlation is generally used to determine the activation threshold.

In addition, switch 42 is closed and reference signal generator 22 is deactivated by controller 24, so that it no longer supplies a signal to reference signal input 16 of differential amplifier 14. Because of the different topology, switch 42 in FIG. 5 would be opened.

If the arrangement has the characteristic 34 of FIG. 3, shifted to the right before the adaptation, with a turned off reference signal Iref, no output signal results, which could be returned via the second feedback as an attenuated signal Ifb_2 to feedback signal input 18 of differential amplifier 14, because the second activation threshold SW2, active in the second feedback, was set earlier to the value of the first activation threshold SW1 (or to a slightly different value). The decoupling circuit 50 decouples a signal from the second feedback, in which the feedback signal Ifb_2 is reflected. The reflection can be identical, for example, so that a signal Ifb_2 is supplied to detector 52. In the indicated case, this signal is initially equal to zero, and/or smaller than a threshold value SW3.

The detector 52 compares the supplied feedback signal Ifb_2 with the predefined threshold value SW3 and supplies an appropriate signal to controller 24 when the values exceed or fall below the third threshold value SW3. Controller 24 controls detector 52 via the dashed connection between blocks 24 and 52, for example, so that detector 52 samples its input signal in a clock pulse predefined by controller 24 and compares it with the third threshold value SW3. The third threshold value SW3 can be dimensioned, for example, in such a way that it corresponds to the value f(SW3) in the plot of FIG. 3. Here, the value f(SW3) in FIG. 3 for reasons of differentiability is drawn relatively high on the P axis and in realizations of the invention is brought still closer to the coordinate origin.

If the third threshold value SW3 is underrun at the beginning, as is the case with characteristic 34 from FIG. 3, controller 24 triggers a stepwise change in the compensation current, which is applied via linkage 56 and at reference signal input 16 and/or via linkage 58 at feedback signal input 18 of differential amplifier 14, via compensation current source 54 to compensate for the offset current active there and for the laser threshold LS of laser diode 12. To achieve the effect of a positive (negative) compensation current at reference signal input 16, a feed to feedback signal input 18 with a negative (positive) sign must occur. As already noted, characteristic 34 corresponds to a negative total offset, so that controller 24 in this case sets a positive compensation current of compensation current source 54, when the compensation current is supplied via reference signal input 16. This is reflected in a change in feedback signal Ifb_2 via the second feedback.

In the case of characteristic 34 of FIG. 3, the impression of a positive compensation current in linkage 56 causes a shift of characteristic 34 to the left. As a result, the intersection of characteristic 34 with the P axis becomes lower. With a repeated increase in the positive compensation current by controller 24 in conjunction with compensation current source 54, characteristic 34 moves successively further to the left until the value f(SW3) is attained. This attainment is detected by detector 52 and recorded by controller 24. Controller 24 orders the compensation current source 54 to maintain the last employed compensation current value and to use it in the later operating mode with an activated first feedback. Furthermore, controller 24 in the later operating mode opens switch 42 in FIG. 4b, to deactivate the second feedback during normal operation. The same effect of a deactivation of the second feedback is achieved in the embodiment according to FIG. 5 by means of closing of switch 42.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for determining a laser threshold of a laser diode, which is operated by a drive circuit as a function of a first signal in a first feedback and a second signal in a second feedback, the method comprising the steps of:
   supplying the first feedback via an optical coupling of an optical output signal of the laser diode;
   supplying the second feedback by an electrical signal picked up between the drive circuit and the laser diode independent of the optical coupling;
   comparing the electrical signal with an adjustable activation threshold;
   transmitting only a portion of the electrical signal that exceeds an adjustable activation threshold to the drive circuit in such a way that the second feedback is active only when the portion occurs;
   changing the adjustable activation threshold so that an activity state of the second feedback changes; and
   determining the laser threshold of the laser diode as a function of a value of the adjustable activation threshold during a change in the activity state of the second feedback, wherein the first feedback is derived from an output of said drive circuit and the second feedback is also derived from said output of said drive circuit.

2. A drive circuit, which determines a laser threshold of a laser diode, wherein the drive circuit generates a drive signal and the laser diode generates an output signal dependent on the drive signal, the drive circuit comprising:
   a first feedback and a second feedback, the first feedback supplying a portion of the output signal via an optical coupling, the second feedback supplying an electrical signal via an electrical connection to a junction conducting the drive signal between the drive circuit and the laser diode, wherein the drive circuit:
      compares the electrical signal with an adjustable activation threshold;
      transmits only a portion of the electrical signal, which exceeds the adjustable activation threshold, to the drive circuit, in such a way that the second feedback is active only when such a portion occurs;

changes the adjustable activation threshold so that an activity state of the second feedback changes; and determines the laser threshold of the laser diode as a function of the value of the adjustable activation threshold during a change in the activity state of the second feedback, wherein the second feedback has a threshold value filter, which allows only signals to pass that exceed the adjustable threshold value.

3. The drive circuit according to claim 2, wherein the threshold value filter is a controllable current source, which receives or emits a current up to a current intensity corresponding to the adjustable threshold value.

4. A drive circuit, which determines a laser threshold of a laser diode, wherein the drive circuit generates a drive signal and the laser diode generates an output signal dependent on the drive signal, the drive circuit comprising:

a first feedback and a second feedback, the first feedback supplying a portion of the output signal via an optical coupling, the second feedback supplying an electrical signal via an electrical connection to a unction conducting the drive signal between the drive circuit and the laser diode, wherein the drive circuit:

compares the electrical signal with an adjustable activation threshold;

transmits only a portion of the electrical signal, which exceeds the adjustable activation threshold, to the drive circuit, in such a way that the second feedback is active only when such a portion occurs;

changes the adjustable activation threshold so that an activity state of the second feedback changes; and determines the laser threshold of the laser diode as a function of the value of the adjustable activation threshold during a change in the activity state of the second feedback, wherein the drive circuit has a differential amplifier with an output, which provides the drive signal, a reference signal input, which is supplied by a reference signal generator, and a feedback signal input, which is coupled both to the first feedback and to the second feedback.

5. The drive circuit according to claim 4, wherein the second feedback has a decoupling circuit, which decouples a feedback signal from the second feedback and supplies it to a subcircuit, which monitors an activity state of the second feedback.

6. The drive circuit according to claim 5, wherein the decoupling circuit has a current mirror, which reflects a current supplied from the differential amplifier to the second feedback, both in a branch circuit leading to the feedback signal input and also in a measuring branch of the subcircuit.

7. The drive circuit according to claim 6, wherein the subcircuit has a detector, which determines a signal strength of the decoupled feedback signal and transmits it to a controller.

8. The drive circuit according to claim 7, wherein the detector periodically samples the signal strength.

9. The drive circuit according to claim 7, wherein the detector is a clocked comparator.

10. The drive circuit according to claim 5, wherein the subcircuit includes an offset compensation signal source, wherein the subcircuit, after storing the measurement for the laser threshold on the basis of the measurement, forms and stores a compensation signal, which compensates the first activation threshold to a defined residual offset, and wherein the compensation signal source provides the stored compensation signal in addition to a reference signal supplied by the reference signal generator to the reference signal input, or to the feedback signal input.

* * * * *